US008649989B2

(12) United States Patent
Hillman, Jr. et al.

(10) Patent No.: US 8,649,989 B2
(45) Date of Patent: Feb. 11, 2014

(54) TIME-DOMAIN TRIGGERING IN A TEST AND MEASUREMENT INSTRUMENT

(75) Inventors: Alfred K. Hillman, Jr., Banks, OR (US); Marcus K. Da Silva, Portland, OR (US); Kathryn A. Engholm, Portland, OR (US); Kenneth P. Dobyns, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 249 days.

(21) Appl. No.: 12/856,472

(22) Filed: Aug. 13, 2010

(65) Prior Publication Data

US 2012/0041701 A1 Feb. 16, 2012

(51) Int. Cl.
*G01R 23/16* (2006.01)
(52) U.S. Cl.
USPC ............... 702/76; 702/57; 702/66; 702/75
(58) Field of Classification Search
USPC ................ 702/66, 76, 57, 75; 455/522; 324/76.77–76.81
See application file for complete search history.

(56) References Cited

U.S. PATENT DOCUMENTS

| 2005/0130687 A1* | 6/2005 | Filipovic et al. ............ 455/522 |
| 2008/0082278 A1* | 4/2008 | Tan et al. ...................... 702/76 |
| 2010/0204937 A1* | 8/2010 | Harwood ....................... 702/66 |

OTHER PUBLICATIONS

Fundamentals of real-time spectrum analysis, Tektronix, 2007.*

* cited by examiner

*Primary Examiner* — Sujoy Kundu
*Assistant Examiner* — Harun Chowdhury
(74) *Attorney, Agent, or Firm* — Thomas F. Lenihan; Marger, Johnson & McCollom, P.C.

(57) ABSTRACT

Embodiments of this invention provide enhanced triggering capabilities such as frequency and phase triggering in a test and measurement instrument, such as a Real-Time Spectrum Analyzer (RTSA) or oscilloscope. A test and measurement instrument can include input terminals to receive RF signals, an ADC to digitize the RF signals, a digital downconverter to produce I and Q baseband component information, and a power detector to determine a power level using the I and Q information. A comparator compares the power level received from the power detector with a user-definable power threshold, and produces a logic signal for enabling one or more phase or frequency demodulators. The one or more demodulators produce IQ-based time-domain traces derived from the I and Q component information when the power level determined by the power detector exceeds the power threshold. Trigger circuitry is configured to trigger on an event responsive to a delayed trigger enable signal.

18 Claims, 6 Drawing Sheets

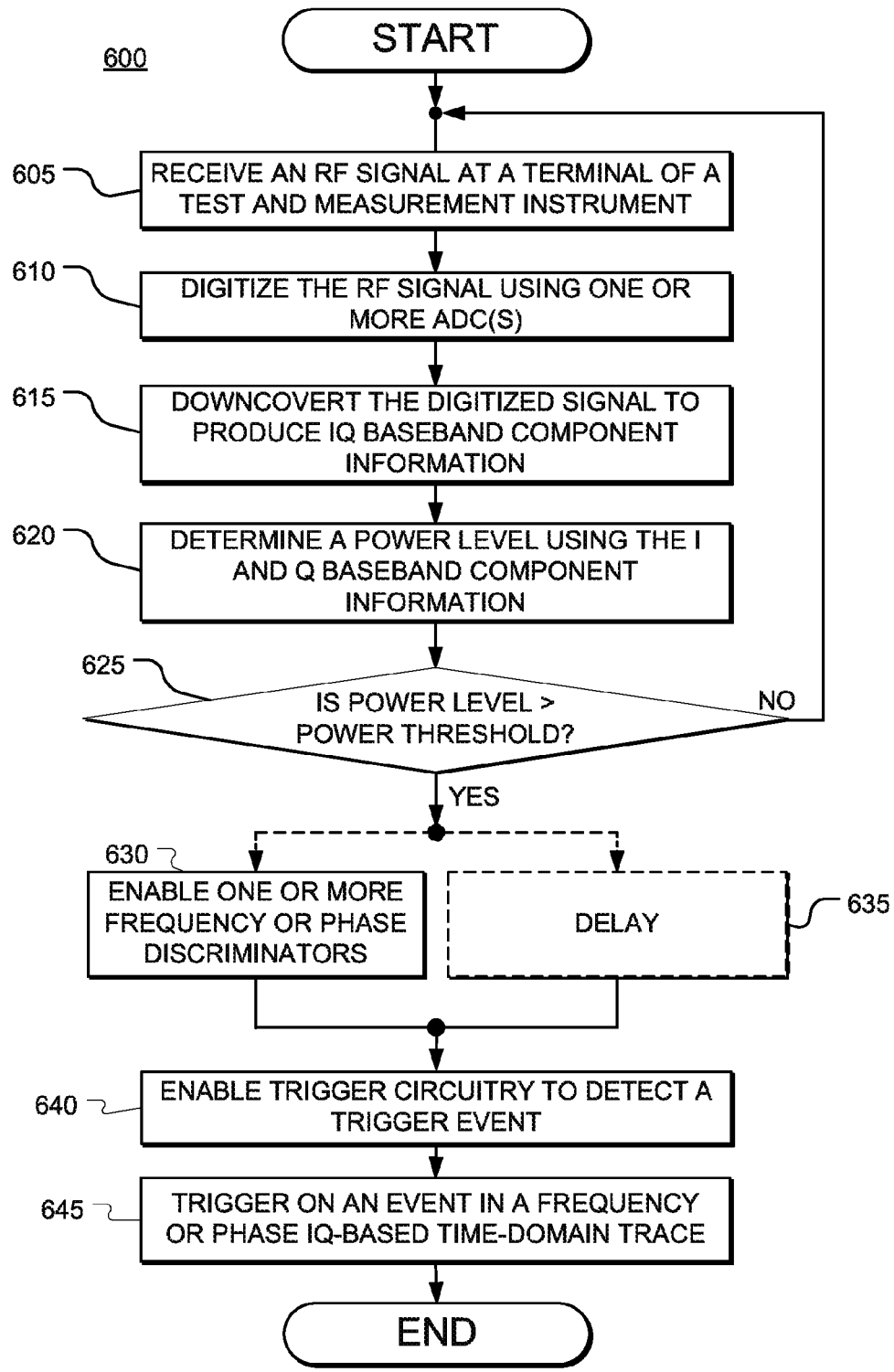

TIME-DOMAIN TRIGGERING IN A TEST AND MEASUREMENT INSTRUMENT

BACKGROUND

Traditionally, spectrum analyzers have had minimal triggering capabilities. For instance, a common display on a spectrum analyzer, of power-versus-frequency, was normally untriggered. Recently, as spectrum analyzers have converted to digital acquisition technology, more advanced triggering has been introduced.

With today's communication standards, frequency hopping and phase modulation are becoming more prevalent. In frequency hopping applications, the power of a radio frequency (RF) signal is constant as the frequency changes. This renders the traditional power trigger useless because there is no change in power to trigger on. Users need to be able to trigger (and thus, acquire data) when a particular frequency is reached or when a particular phase value is reached. Conventional approaches to solve these problems in spectrum analyzers, such as via a frequency mask triggering approach, can discourage users for a variety of reasons. For instance, the time resolution is too granular to achieve desired trigger performance in many applications. In addition, the ability to resolve closely spaced frequency components can be limited with the frequency mask trigger.

Moreover, RF signals often include pulses or RF "bursts" in which information is transmitted during a burst of activity, followed by periods of inactivity or noise. This can lead to false and inaccurate triggering. Current techniques do not provide a trigger that easily isolates the frequency or phase event of interest and then trigger on and/or capture only the data that is of interest. If the event of interest occurs only rarely (e.g., once per day or week), it is impractical to store enough acquisition data to ensure the event can be seen and analyzed.

Accordingly, a need remains for a more flexible instrument and method for generating triggers for frequency and phase information.

SUMMARY

Embodiments of this invention provide enhanced triggering capabilities such as frequency and phase triggering in a test and measurement instrument, such as a Real-Time Spectrum Analyzer (RTSA) or oscilloscope.

In some example embodiments of the invention, a test and measurement instrument includes an input terminal to receive a radio frequency (RF) signal under test, an analog-to-digital converter (ADC) to digitize the RF signal, a digital downconverter to produce I (in-phase) and Q (quadrature) baseband component information from the digitized RF signal, a power detector to determine a power level using the I and Q baseband component information, and one or more demodulators to produce IQ-based time-domain traces when the power level determined by the power detector exceeds a predefined power threshold. The predefined power threshold can be user-definable.

The instrument can further include a comparator operatively coupled to the power detector and configured to compare the user-definable power threshold with the power level received from the power detector. The comparator can produce a logic signal for enabling the one or more demodulators. Trigger circuitry is configured to trigger on an event associated with the IQ-based time-domain traces responsive to the enable signal or a delayed trigger enable signal.

In some embodiments, a method is provided for triggering on an event associated with an IQ-based time-domain trace, the method including receiving a radio frequency (RF) signal under test at a terminal of a test and measurement instrument, digitizing the RF signal under test using an ADC, downconverting the digitized signal and producing I and Q baseband component information, determining a power level using the I and Q baseband component information, comparing a user-definable power threshold with the power level, and producing an enable signal when the power level exceeds the user-definable power threshold.

BRIEF DESCRIPTION OF THE DRAWINGS

FIG. 6 is a flow diagram demonstrating a technique for triggering on an event associated with a frequency or phase time-domain trace, according to some embodiments.

DETAILED DESCRIPTION

Embodiments of this invention provide enhanced triggering capabilities such as frequency and phase triggering in a test and measurement instrument, such as a Real-Time Spectrum Analyzer (RTSA) or oscilloscope.

Figure 1A:
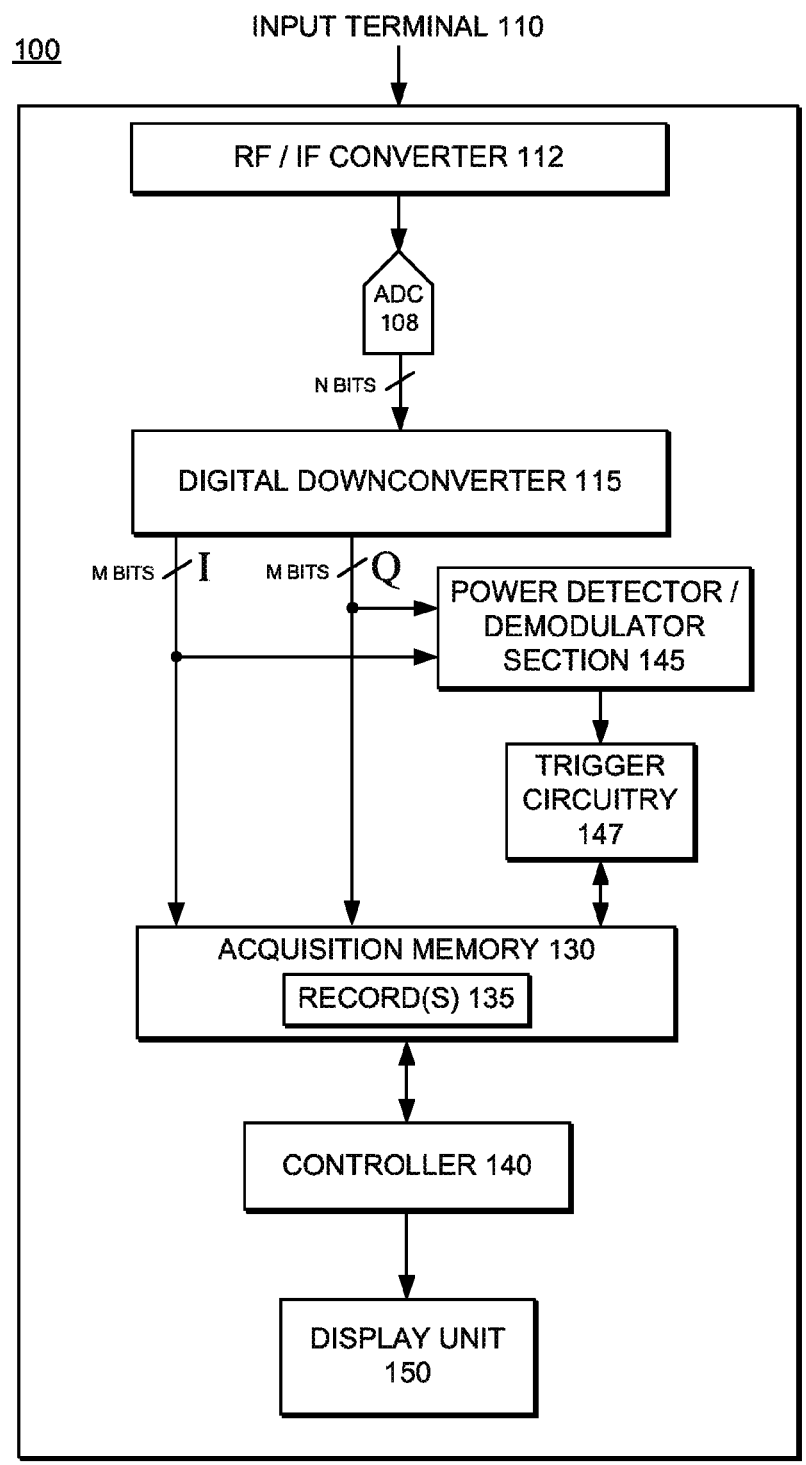
FIG. 1A illustrates a block diagram of a test and measurement instrument including an RF/IF converter, an analog-to-digital converter (ADC), a digital downconverter, an acquisition memory to store one or more records, a power detector/demodulator section, trigger circuitry, a controller, and a display unit, according to an example embodiment of the invention.

FIG. 1A illustrates a block diagram of a test and measurement instrument 100 including an RF/IF converter 112, ADC 108, a digital downconverter 115, an acquisition memory 130 to store one or more records 135, a power detector/demodulator section 145, trigger circuitry 147, a controller 140, and a display unit 150, according to an example embodiment of the invention.

The test and measurement instrument 100 is preferably a digital spectrum analyzer such as an RTSA, but can also comprise an oscilloscope, or other suitable measurement device. For the sake of brevity and consistency, but not limitation, the test and measurement instrument will generally be referred to herein as a signal analyzer.

The signal analyzer 100 may have multiple channels or inputs, such as input terminal 110, suitable for use with various embodiments as described herein. The input terminal 110 can receive signals having a frequency, for example, of between DC to 20+ GHz. Although the signal analyzer may have a single input terminal 110, inventive aspects described are equally applicable to a signal analyzer having two inputs, four inputs, or any number of inputs. While components of the signal analyzer 100 are shown to be directly coupled to each other, it should be understood that the signal analyzer 100 can include a variety of other circuit or software components, inputs, outputs, and/or interfaces, which are not necessarily shown, but that are disposed between or otherwise associated with the illustrated components of signal analyzer 100.

An electrical signal under test, preferably an RF signal, is received at the input terminal 110. The RF signal can be converted to an analog intermediate frequency (IF) signal by the RF/IF converter 112, which can filter the signal prior to being digitized by an ADC 108. The digital downconverter 115 can produce I and Q baseband component information from the digitized IF signal. However, reference herein will generally be made to an "RF signal" or "RF signals" and it should be understood that such reference can include one or more RF signal, or, one or more IF signal derived from the RF signal.

The ADC 108 is structured to digitize the RF signal under test. The digital downcoverter 115 is operatively coupled to the ADC 108, receives the digitized RF signal, and produces I (in-phase) and Q (quadrature) baseband component information from the digitized RF signal. More specifically, the downconverter 115 can numerically multiply a sine and cosine with the digitized RF signal, thereby generating the I and Q component information, which contains all of the information present in the original RF signal. Although the implementation of the digital downconverter 115 can vary depending on whether the test and measurement instrument is an RTSA or an oscilloscope, in any case, the hardware or software used to implement this component operates at a rate that is sufficient to provide the I and Q component information in real-time.

The I and Q component information is transmitted to a power detector/demodulator section 145, which also can process the information in real-time. Each of the I and Q component information can be transmitted over multiple lines corresponding to M bits of information, as illustrated in FIG. 1A. As will further be described below, the power detector/demodulator section prevents false triggers and avoids invalid data from being generated because of noise present when no valid RF input signal is present. In addition, the section 145 produces IQ-based time-domain traces, such as phase-versus-time and/or frequency-versus-time traces, which are transmitted to trigger circuitry 147. The terms "trace" and "traces" should be understood broadly to include any information or data, which can be stored, and/or plotted on a display device, and can convey information to a user about a received signal, a derived signal, or a generated signal.

Trigger circuitry 147, when enabled, can trigger in real-time on one or more events associated with the frequency-versus-time trace or the phase-versus-time trace. An interval or area of interest at or around the trigger event can be displayed using display unit 150 so that a user of the signal analyzer can analyze the area of interest. Additional details of the various components and techniques implemented by the power detector/demodulator section 145 and trigger circuitry 147 are provided below.

An acquisition memory 130 is operatively coupled to the digital downconverter 115 and is configured to acquire and store one or more records 135 of the digitized I and Q baseband component information associated with the RF signal. In other words, the acquisition memory 130 receives the I and Q baseband component information from the digital downconverter 115 and stores it. Each input terminal 110 of the signal analyzer can have associated therewith a different portion of the acquisition memory 130 or a different record 135 in which the component information is stored. The acquisition memory 130 can be any variety of memory. For example, the acquisition memory 130 can be volatile memory, non-volatile memory, dynamic random-access memory, static memory, or the like.

The signal analyzer 100 includes a controller 140 that can be operatively coupled to the acquisition memory 130, and can access and/or process the I and Q baseband component information from the acquisition memory 130. The controller 140 can access and/or process the acquired data either during or subsequent to the actual acquisition of the data. The controller 140 is also coupled to the display unit 150 and produces corresponding waveforms or spectra for display by the display unit 150.

Any of the RF/IF converter 112, the ADC 108, the digital downconverter 115, the power detector/demodulator section 145, the trigger circuitry 147, the acquisition memory 130, the controller 140, and the display unit 150, may exist in or be implemented using hardware, software, firmware, or by any combination thereof.

Figure 1B:
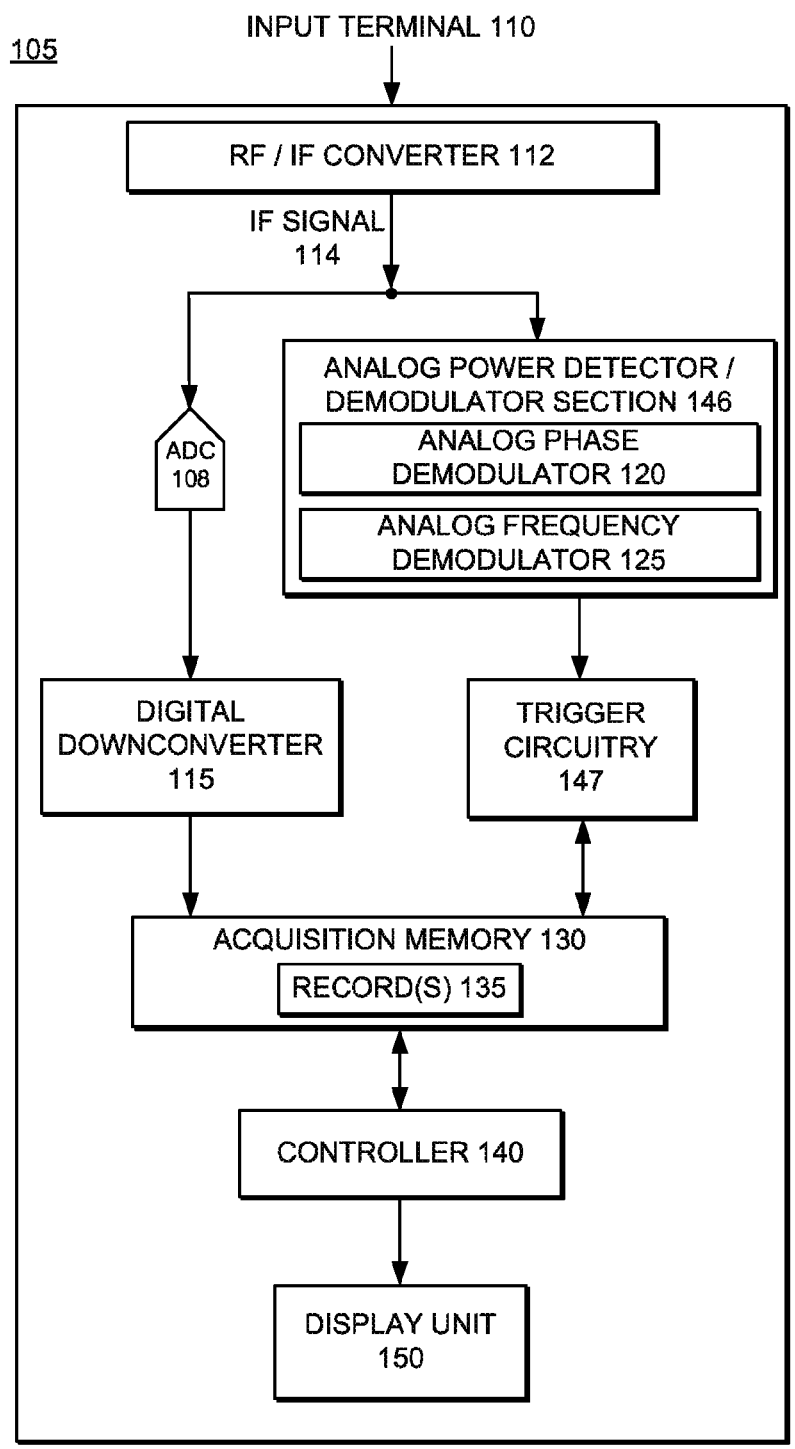
FIG. 1B illustrates a block diagram of a test and measurement instrument similar to the test and measurement instrument illustrated in FIG. 1A, but including an analog power detector/demodulator section, which receives an intermediate frequency (IF) signal, and produces an enable signal.

FIG. 1B illustrates a block diagram of a test and measurement instrument 105 similar to the test and measurement instrument 100 illustrated in FIG. 1A, but including an analog power detector/demodulator section 146, which receives an IF signal 114, and produces an enable signal for the trigger circuitry 147.

As with the signal analyzer 100 of FIG. 1A, it should be understood that the signal analyzer 105 can include a variety of other circuit or software components, inputs, outputs, and/or interfaces, which are not necessarily shown, but that are disposed between or otherwise associated with the illustrated components of signal analyzer 105.

An electrical signal under test, preferably an RF signal, is received at the input terminal 110. The RF signal can be converted to an IF signal by the RF/IF converter 112, which can filter or otherwise reduce the noise in the input signal. An analog power detector/demodulator section 146 can receive the IF signal from the RF/IF converter 112, and determine a power level of the IF signal. The analog power detector/demodulator section 146 can produce a trigger enable signal when the power level exceeds a predefined or user-definable power threshold.

The signal analyzer 105 can include trigger circuitry 147 to trigger on an event associated with at least one time-domain trace responsive to the trigger enable signal. The time-domain trace can include, for example, a phase-versus-time trace, a frequency-versus-time trace, or an amplitude (power-versus-time) trace. The time-domain traces can be produced by one or more analog demodulators, such as the analog phase demodulator 120 or the analog frequency demodulator 125. In some embodiments, the one or more analog demodulators can produce the time-domain traces after the power level exceeds the predefined or user-definable power threshold.

Figure 2:
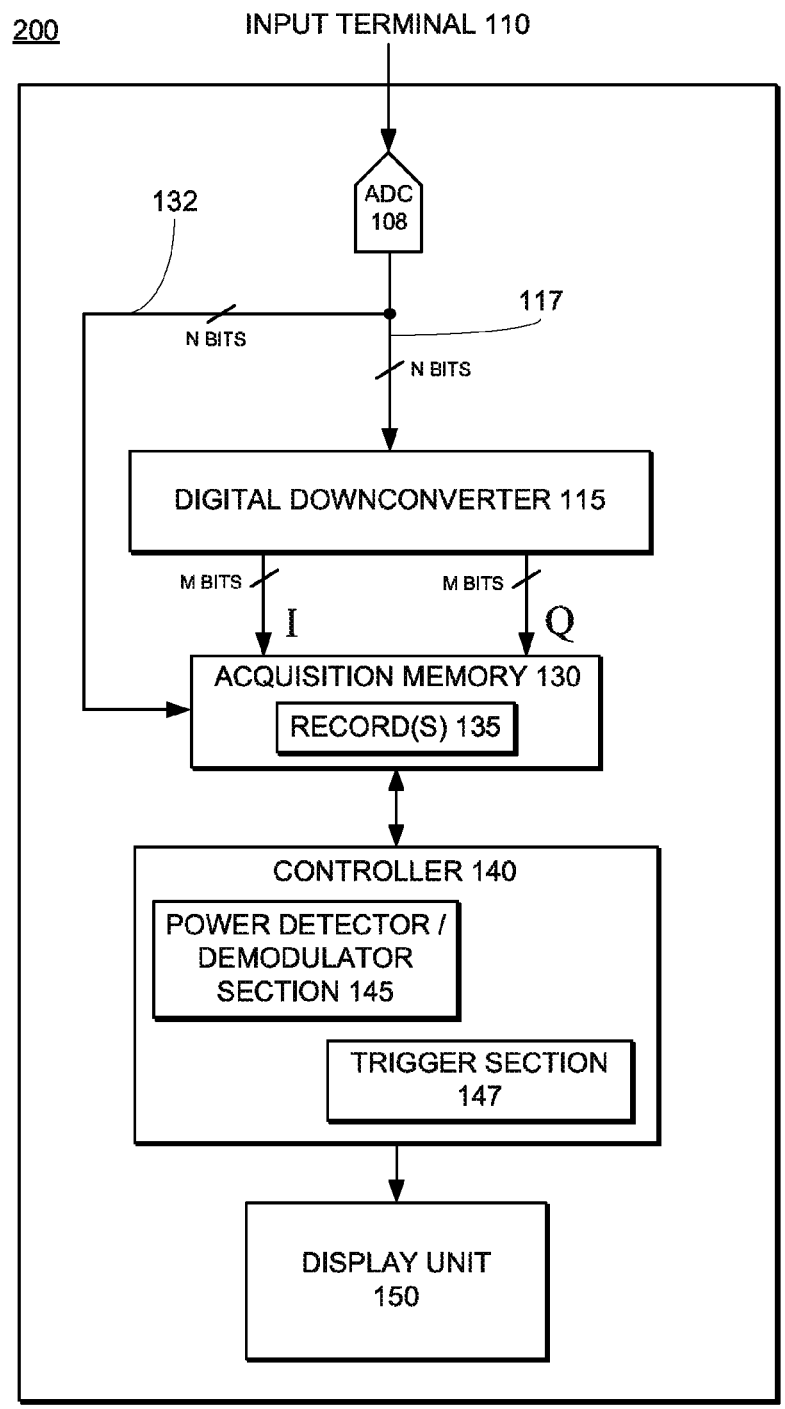
FIG. 2 illustrates a block diagram of a test and measurement instrument similar to the test and measurement instrument illustrated in FIG. 1A, but including a line directly between the ADC and the acquisition memory, and including a controller having the power detector/demodulator section and a trigger section, according to another example embodiment of the invention.

FIG. 2 illustrates a block diagram of a test and measurement instrument 200 similar to the test and measurement instrument 100 illustrated in FIG. 1A. Of note, however, is line 132, which directly connects the output of the ADC 108 to the acquisition memory 130 over multiple lines corresponding to N bits of information, as illustrated in FIG. 2. The information received over line 132 can include digitized RF signal information, which can be later processed, for example, using the downconverter 115 and/or the controller 140.

In addition, the controller 140 may include the power detector/demodulator section 145 and a trigger section 147, and process information received from the acquisition memory 130. The information stored in the one or more records 135 by the acquisition memory 130 and processed by the controller 140 can include, for example, the I and Q baseband component information or the digitized RF signal information received over the line 132. The trigger section 147, when enabled, can trigger in real-time, or subsequent to acquisition, on one or more events associated with the frequency-versus-time trace or the phase-versus-time trace. An interval or area of interest at or around the trigger event can be displayed using display unit 150 for analysis by a user of the signal analyzer.

Any of the ADC 108, the digital downconverter 115, the acquisition memory 130, the controller 140 including the power detector/demodulator section 145 and the trigger section 147, and the display unit 150, may exist in or be implemented using hardware, software, firmware, or by any combination thereof.

Figure 3:
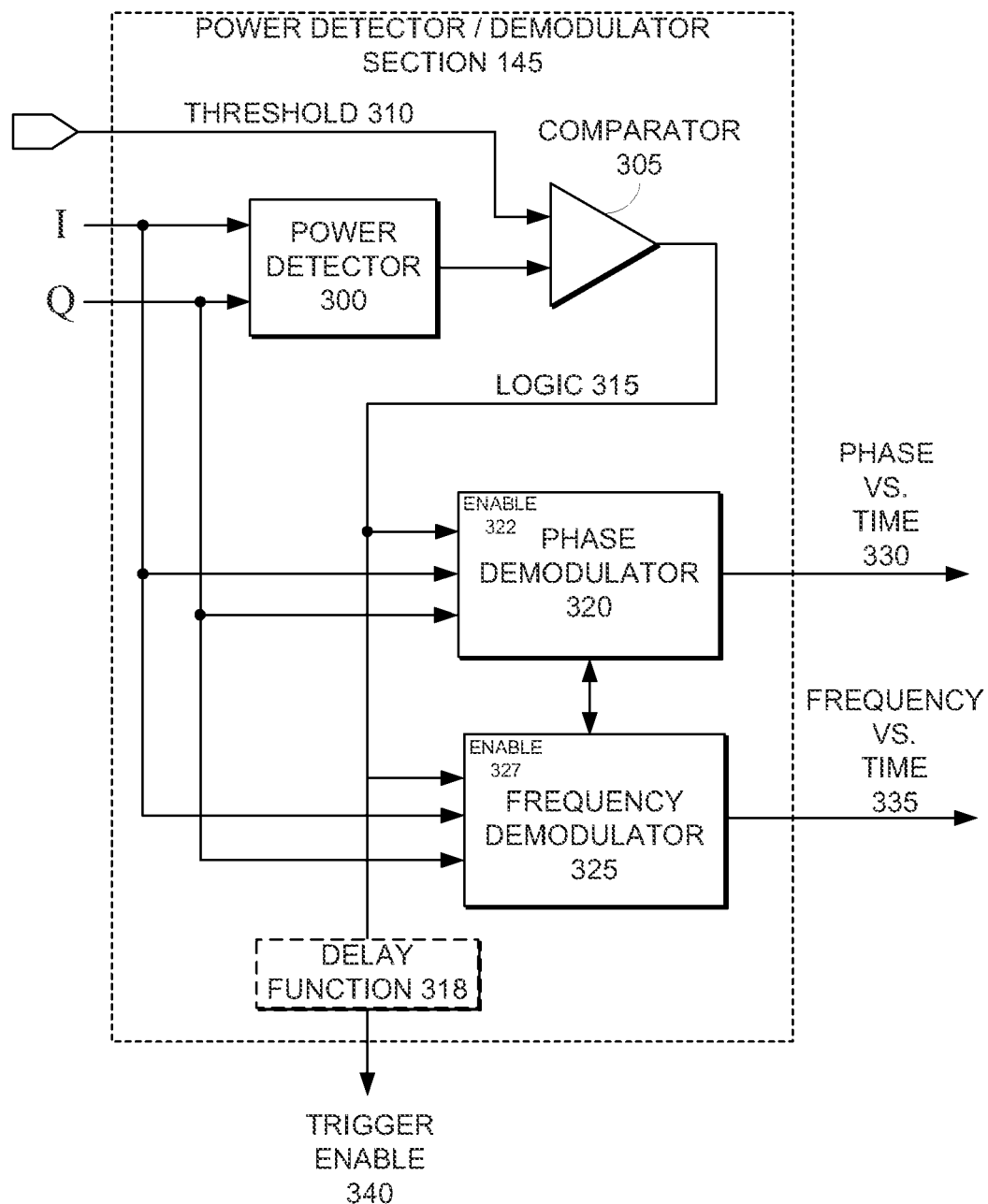
FIG. 3 illustrates a block diagram of the power detector/demodulator section of FIGS. 1A and 2, in accordance with an example embodiment of the invention.

FIG. 3 illustrates a block diagram of the power detector/demodulator section 145 of FIGS. 1A and 2, in accordance with an example embodiment of the invention. In many modern communication systems, signals such as RF signals are not on all of the time. Rather, a signal is pulsed on, information is communicated, and then the signal is turned off. The power detector/demodulator section 145 prevents the generation of invalid data from the noise present when no RF signal is present, among other suitable operations.

For example, the power detector 300 can determine a power level using the I and Q baseband component information. More specifically, the power detector 300 can determine the envelope power of the RF signal by computing $I^2+Q^2$, or in other words, the square of I added to the square of Q. A predefined or user-definable power threshold 310 is compared to the power level generated by the power detector 300. A comparator 305 is operatively coupled to the power detector 300 and configured to compare the power threshold 310 with the power level received from the power detector 300. As a result, the comparator 305 produces a logic signal 315. The logic signal 315 can be used for enabling one or more demodulators such as phase demodulator 320 and frequency demodulator 325. It should be understood that a "demodulator" can include different types of demodulator circuitry or software, including such things as phase, frequency or amplitude discriminators, and/or any type of suitable demodulator. The demodulators can also include, for example, quadrature amplitude modulation (QAM), quadrature phase-shift keying (QPSK), and/or pulse-amplitude modulation (PAM) components, among other possibilities.

In some embodiments, when the logic signal 315 is HIGH, the power level exceeds the predefined or user-definable power threshold 310, and the demodulators 320 and 325 are then enabled. The one or more demodulators (e.g., 320 and/or 325) produce IQ-based time-domain data or traces. As one example, the phase demodulator 320 can generate a phase of each downconverted sample point by calculating an arctangent of (Q divided by I), i.e., ARCTAN (Q/I). The frequency demodulator 325 can generate an instantaneous frequency at each downconverted sample point by calculating a derivative with respect to time of the phase, i.e., d/dt (phase). The phase and the frequency are used by the phase demodulator 320 and the frequency demodulator 325 to generate and output a phase-versus-time trace and a frequency-versus-time trace, respectively. Enable ports 322 and 327 receive an enable signal 315 when the power level determined by the power detector 300 exceeds the predefined or user-definable power threshold. In addition, the amplitude of the I and/or Q signal can be determined and used to produce IQ-based time-domain traces or information.

In this manner, the phase and frequency demodulators are enabled to produce an amplitude trajectory, a phase trajectory, or a frequency trajectory, and to trigger on such trajectories. A trajectory can be, for example, a transition of the amplitude, phase, or frequency in a certain direction through a threshold. In some embodiments of the invention, the phase and frequency demodulators are enabled to produce the IQ-based time-domain traces when a valid RF signal is present at an input terminal of the signal analyzer, and are prevented from producing the IQ-based time-domain traces in the absence of a valid RF signal or when merely noise is being received at the input terminal.

Moreover, the logic signal 315 can include or correspond to a trigger enable signal 340, which can be transmitted to the trigger circuitry 147. The term "trigger circuitry" should be understood broadly to include either the trigger circuitry 147 of FIG. 1A or the trigger section 147 of FIG. 2. The trigger circuitry 147 is configured to trigger on an event associated with the IQ-based time-domain traces responsive to the trigger enable signal 340, thereby preventing false trigger signals, particularly in the absence of a valid RF signal. Put differently, the trigger circuitry 147 is configured to trigger on an event associated with the frequency-versus-time trace or the phase-versus-time trace after receiving the trigger enable signal 340 produced by the comparator 305.

A delay function 318 can be included in the power detector/demodulator section 145 for delaying the logic signal 315 produced by the comparator 305. In some embodiments, the logic signal 315 is delayed until the power level exceeds the power threshold 310 for a predefined period of time. This time delay allows for transient events that may be present in the RF signal or the derived IQ-based time-domain traces to settle out before making phase or frequency determinations, or before triggering on an event. Where the delay function 318 is used, the trigger circuitry 147 can trigger on an event associated with the IQ-based time-domain traces responsive to or after receiving the delayed trigger enable signal 340.

The trigger enable signal 340 can cause the trigger circuitry 147 to be continuously enabled for a duration of time until the power level falls below the power threshold 310. Alternatively, the trigger enable signal 340 can cause the trigger circuitry 147 to be enabled for a predefined or user-definable length of time. Once enabled, triggering can be performed on any of the derived frequency or phase information such as the frequency-versus-time trace and/or the phase-versus-time trace. In other words, the actual trigger event occurs after the trigger circuitry 147 has been enabled.

In an alternative embodiment, the phase and frequency demodulators (e.g., 320 and/or 325) are essentially always enabled (e.g., enabled by default), and only the trigger circuitry 147 is enabled or not based on the logic signal 315 or trigger enable signal 340. In other words, the logic signal 315 can be used to control only the trigger circuitry 147. As mentioned above, the trigger enable signal 340 can be delayed using the delay function 318 to prevent false triggers.

In yet another embodiment, the phase and frequency demodulators (e.g., 320 and/or 325) are essentially always enabled (e.g., enabled by default), but the output of the phase and frequency demodulators can be suppressed or annotated based on certain conditions, such as when the power level determined by the power detector 300 is less than the predefined or user-definable power threshold.

Figure 4:
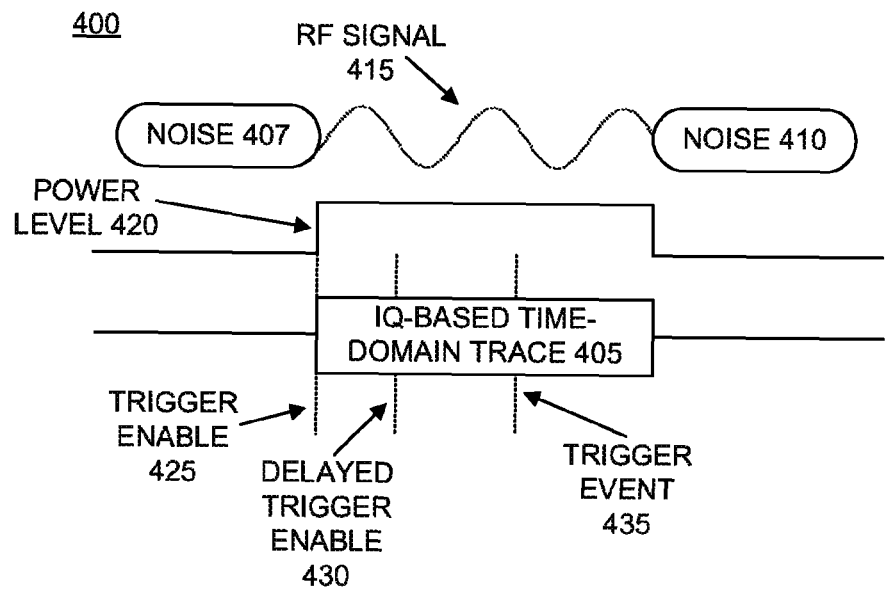
FIG. 4 illustrates a simplified diagram including an RF signal, a power level signal, and an IQ-based time-domain trace with various trigger enable characteristics and a trigger event, in accordance with an example embodiment of the invention.

FIG. 4 illustrates a simplified diagram 400 including an RF signal 415, a power level signal 420, and an IQ-based time-domain trace 405 with various trigger enable characteristics (e.g., 425 and 430) and a trigger event 435, in accordance with an example embodiment of the invention. Reference will be made to some of the components of FIGS. 1-3 while discussing the various signals and traces of FIG. 4.

To accurately analyze phase and frequency, the signal can be qualified with amplitude or power. In the absence of a valid RF signal 415, noise such as 407 or 410 may be present on an input terminal of a signal analyzer. The phase of noise is more noise. Similarly, the frequency of noise is more noise. Therefore, components such as the power detector 300 and the comparator 305 are used to qualify the RF signal 415, or in other words, to prevent the generation of IQ-based time-domain trace 405 or event triggers (e.g., 435) until a valid RF signal 415 is present. As shown in FIG. 4, the power level 420 is low in the presence of noise 407 and 410, and high in the presence of a valid RF signal 415. When the power level 420 is high, the phase demodulator 320 and the frequency demodulator 325 are enabled to produce the IQ-based time-domain trace 405, such as a frequency-versus-time trace or a phase-versus-time trace. In this example, the IQ-based time-domain trace 405 begins to be generated at or about the time that the power level 420 exceeds the predefined or user-definable power threshold 310. In addition, at or about this same time, the trigger enable signal 425 can be produced by the comparator 305, thereby enabling the trigger circuitry 147.

Where the delay function 318 is included in the power detector/demodulator section 145, the delayed trigger enable signal 430 is produced rather than the trigger enable signal 425. After the trigger circuitry 147 is enabled, and when an event within the IQ-based time-domain trace 405 meets certain trigger criteria, the trigger event 435 occurs, and the waveforms or spectra around the trigger event 435 are displayed on the display unit 150 for analysis by the user.

Criteria to cause the trigger circuitry 147 to trigger on the event can be configured by a user of the signal analyzer. Various types of triggers can be configured. For example, the trigger can be generated whenever the IQ-based time-domain trace 405 such as the frequency-versus-time trace or phase-versus-time trace exceeds a threshold. Alternatively, the trigger can be generated whenever the IQ-based time-domain trace exceeds a threshold after previously being below the threshold.

In some embodiments, the phase and frequency demodulators tend to be noisy, and so hysteresis can be used in the trigger circuitry 147, which causes the trigger event 435 when the IQ-based time-domain trace 405 exceeds a lower threshold and then exceeds an upper threshold. In other words, trace values which only exceed the lower threshold are not considered a trigger event, thereby avoiding false triggers.

In some embodiments, trigger events can be qualified by time. That is, the trigger circuitry 147 can trigger on an event in the IQ-based time domain trace 405 when the IQ-based time-domain trace is above a threshold for at least one of (a) longer than a predefined period of time, (b) shorter than the predefined period of time, (c) within a predefined time range, and (d) outside of the predefined time range. Similarly, the trigger circuitry 147 can trigger on an event in the IQ-based time domain trace 405 when the IQ-based time-domain trace is below a threshold for at least one of (a) longer than a predefined period of time, (b) shorter than the predefined period of time, (c) within a predefined time range, and (d) outside of the predefined time range.

As another example, the trigger event 435 can be caused by a runt. A runt is a meta-stable condition that can cause a system to enter an unknown state. For example, the trigger circuitry 147 can trigger on an event in the IQ-based time-domain trace 405 when the IQ-based time-domain trace 405 exceeds a lower threshold and does not exceed an upper threshold. A runt polarity of positive, negative, or either can be selected. This trigger event criteria can be combined with the trigger events qualified by time, as described above.

In some embodiments, the trigger event 435 can be qualified by a window. In other words, the trigger circuitry 147 can trigger on an event in the IQ-based time-domain trace 405 when the IQ-based time-domain trace 405 is within a window defined by first and second thresholds, such as a low threshold and a high threshold. The trigger event can also be caused if the trace is outside of a window defined by first and second thresholds, or the low and high thresholds. The window criteria can also be combined with the time-qualified criteria mentioned above.

In some embodiments, the trigger event 435 can be qualified by a logic condition. For example, the trigger circuitry 147 can trigger on an event in the IQ-based time-domain trace 405 when a combination of the I and Q baseband component information corresponds to a predefined or user-definable logic state. This criteria can also be combined with the time-qualified criteria mentioned above.

In some embodiments, the trigger event 435 can be qualified by a sequence. For instance, the trigger circuitry 147 can trigger on an event in the IQ-based time-domain trace 405 responsive to a predefined sequence of states. The states can include, for example, a first state in which the IQ-based time-domain trace is above a threshold, and a second state in which the IQ-based time-domain trace is below the threshold. The states, taken as a sequence, can define the trigger condition.

These and other trigger criteria and/or trigger conditions can be used to cause the trigger circuitry 147 to trigger on one or more events in the IQ-based time-domain trace 405, and it should be understood that embodiments of the invention are not limited to the trigger criteria and conditions expressly disclosed herein.

Figure 5:
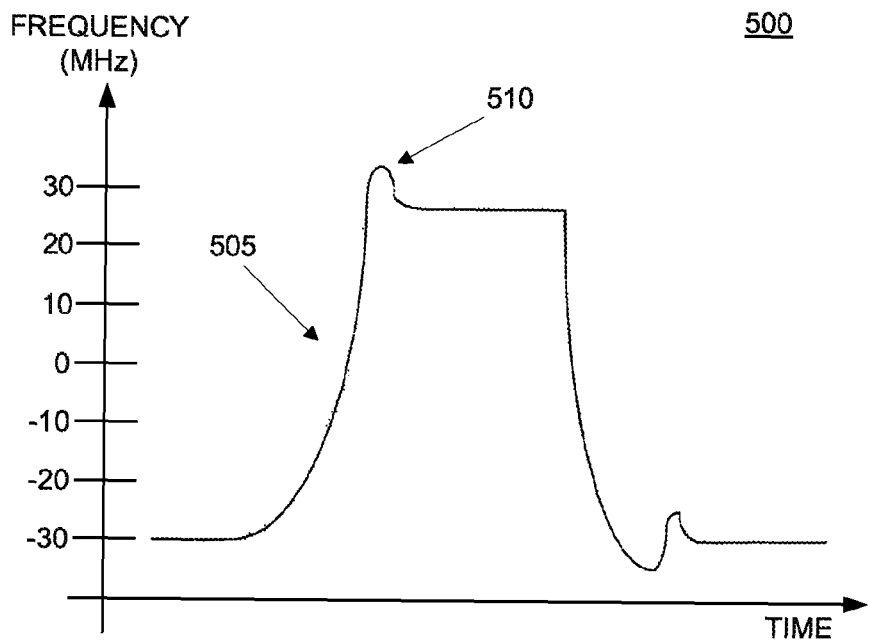
FIG. 5 illustrates a frequency hopping signal as plotted in a frequency-versus-time trace diagram showing various characteristics and triggering techniques according to some embodiments of the invention.

FIG. 5 illustrates a frequency hopping signal as plotted in a frequency-versus-time trace diagram 500 showing various characteristics and triggering techniques according to some embodiments of the invention. In this example diagram, the frequency is shown in units of mega-hertz (MHz) along the vertical axis and units of time along the horizontal axis, and represents a frequency measurement relative to a reference frequency value. In FIG. 5, the frequency is shown relative to a center frequency, which is typical for a signal analyzer display. Since the signal analyzer controls the center frequency setting, it is also possible to provide this information in absolute frequency if desired by the user.

In this example, a user can set a trigger level in terms of frequency. By triggering when the frequency went above +10 MHz, the user can gather acquisition data around the rising edge of the frequency hop 505. Similarly, by setting the trigger level at a little above +30 MHz, the user can gather data about the small overshoot 510 in the frequency hop.

Since the power level during this frequency hop would be constant, an instrument triggering on amplitude would not be able to see this event. Moreover, an instrument triggering on the signal amplitude prior to the conversion by the digital down converter 115 would also not be able to trigger on the frequency hop 505. It would be difficult or impossible to trigger on only the overshoot portion 510 using a conventional frequency mask trigger approach because, for example, of limitations in point granularity; in other words, with a frequency mask, the overshoot would need to be at least several micro-seconds in length. In contrast, using the embodiments as set forth herein, the overshoot 510 can be on the order of nanoseconds, and still be easily triggerable. Similar characteristics and trigger techniques apply to a phase-versus-time trace, as described above.

FIG. 6 is a flow diagram 600 demonstrating a technique for triggering on an event associated with a frequency or phase time-domain trace, according to some embodiments. The technique begins at 605 where an RF signal is received at a terminal of a test and measurement instrument such as a signal analyzer or oscilloscope. The ADC is used to digitize the RF signal at 610. The flow then proceeds to 615 where the digitized signals are downconverted to produce I and Q baseband component information.

At 620, a power level is determined using the I and Q baseband component information. Then, at 625, a predefined or user-definable power threshold is compared with the power level, and a determination is made whether the power level exceeds the power threshold. If NO, the flow returns to the start and the process repeats. Otherwise, if YES, a comparator produces an enable signal when the power level exceeds the power threshold, and the flow proceeds to 630 and 635. At 630, one or more frequency or phase demodulators are enabled, and begin to produce IQ-based time-domain trace information. At 635, the enable signal can be delayed, thereby delaying producing the trigger enable signal until the power level exceeds the power threshold for a predefined period of time. The flow then proceeds to 640 where the trigger circuitry is enabled to detect a trigger event. At 645, the trigger circuitry triggers on an event in the frequency or phase IQ-based time-domain traces.

Although particular embodiments have been described, it will be appreciated that the principles of the invention are not limited to those embodiments. For example, any type of trigger criteria can be used to trigger on an event in the IQ-based time-domain traces—and only during the time in which the trigger circuitry is enabled. Trigger enablement qualifications can be based on amplitude, power, or state of the I and Q baseband component information, among other suitable enablement qualifications. In some embodiments, an article drawn from the set including floppy disks, optical disks, fixed disks, volatile memory, non-volatile memory, random access memory, read-only memory, or flash memory, comprising a machine-accessible medium having associated instructions that, when executed in a test and measurement device, results in a machine performing the steps of the various embodiments of the invention as disclosed herein. Other variations and modifications may be made without departing from the principles of the invention as set forth in the following claims.

What is claimed is:

1. A test and measurement instrument, comprising:
   an input terminal to receive a radio frequency (RF) signal under test;
   an analog-to-digital converter (ADC) to digitize the RF signal;
   a digital downconverter to produce I (in-phase) and Q (quadrature) baseband component information from the digitized RF signal;
   a power detector to determine a power level using the I and Q baseband component information;
   one or more demodulators to produce IQ-based time-domain traces when the power level determined by the power detector exceeds a predefined power threshold, wherein
   the predefined power threshold is user-definable;
   a comparator operatively coupled to the power detector and configured to compare the user-definable power threshold with the power level received from the power detector, the comparator producing a logic signal for enabling the one or more demodulators, wherein
   the logic signal includes a trigger enable signal;
   trigger circuitry configured to trigger on an event associated with the IQ-based time-domain traces responsive to the trigger enable signal when the IQ-based time domain trace is within a window defined by first and second thresholds; and
   a display unit for displaying the I and Q baseband component information in response to a trigger signal generated by the trigger circuitry.

2. The test and measurement instrument of claim 1, further comprising:
   a delay function for delaying the logic signal produced by the comparator until the power level exceeds the user-definable threshold for a predefined period of time.

3. The test and measurement instrument of claim 2, wherein the delayed logic signal includes a delayed trigger enable signal, the instrument further comprising:
   trigger circuitry configured to trigger on an event associated with the IQ-based time-domain traces responsive to the delayed trigger enable signal.

4. The test and measurement instrument of claim 1, wherein the one or more demodulators include at least one of a phase demodulator and a frequency demodulator.

5. The test and measurement instrument of claim 1, wherein the IQ-based time-domain traces include at least one of a frequency-versus-time trace and a phase-versus-time trace.

6. The test and measurement instrument of claim 1, further comprising:
   an RF/IF converter to convert the RF signal to an intermediate frequency (IF) signal, wherein:
   the ADC is configured to digitize the IF signal; and
   the digital downconverter is configured to produce the I and Q baseband component information from the digitized IF signal.

7. The test and measurement instrument of claim 1, further comprising:
   an acquisition memory to store one or more records of the I and Q baseband component information; and
   a controller operatively coupled to the acquisition memory; wherein
   the display unit is operatively coupled to the controller and configured to display the IQ-based time-domain traces, and
   wherein the controller includes a trigger section to trigger on an event associated with the IQ-based time-domain traces after the power level determined by the power detector exceeds the predefined power threshold.

8. A test and measurement instrument, comprising:
   an input terminal to receive a radio frequency (RF) signal under test;
   an RF/IF converter to convert the RF signal to an intermediate frequency (IF) signal;
   an analog power detector and demodulator section to determine a power level of the IF signal, and to produce a trigger enable signal after the power level exceeds a predefined power threshold;

trigger circuitry configured to trigger on an event associated with at least one time-domain trace responsive to the trigger enable signal when time domain trace is within a window defined by first and second thresholds; and a display unit for displaying the at least one time domain trace in response to a trigger signal generated by the trigger circuitry.

9. The test and measurement instrument of claim 8, further comprising:

one or more analog demodulators to produce at least one time-domain trace after the power level exceeds the predefined power threshold.

10. A method for triggering on an event associated with an IQ-based time-domain trace, the method comprising:

receiving a radio frequency (RF) signal under test at a terminal of a test and measurement instrument;

digitizing the RF signal under test using an analog-to-digital converter (ADC);

downconverting the digitized signal and producing I (in-phase) and Q (quadrature) baseband component information;

determining a power level using the I and Q baseband component information;

comparing a user-definable upper power threshold and a user-definable lower power threshold with the power level;

producing an enable signal when the power level exceeds the user-definable power threshold;

enabling one or more demodulators responsive to the enable signal;

the one or more demodulators producing an IQ-based time-domain trace; and enabling trigger circuitry to detect a trigger event in the IQ-based time-domain trace responsive to the enable signal, wherein the one or more demodulators include at least one of a phase demodulator and a frequency demodulator, and the IQ-based time-domain trace includes at least one of a frequency-versus-time trace and a phase-versus-time trace; and wherein the enable signal includes a trigger enable signal;

delaying producing the trigger enable signal until the power level exceeds the user-definable power threshold for a predefined period of time;

triggering on an event in the frequency-versus time trace or the phase-versus-time trace after receiving the delayed trigger enable signal and when the IQ-based time domain trace is within a window defined by first and second thresholds; and displaying, on a display unit, the at least one of a frequency-versus-time trace and a phase-versus-time trace.

11. The method of claim 10, wherein
the triggering on an event step includes triggering on an event in the IQ-based time-domain trace when the IQ-based time-domain trace exceeds a lower threshold and an upper threshold.

12. The method of claim 10, wherein
the triggering on an event step includes triggering on an event in the IQ-based time-domain trace when the IQ-based time-domain trace exceeds a lower threshold and does not exceed an upper threshold.

13. The method of claim 10, wherein
the triggering on an event step includes triggering on an event in the IQ-based time-domain trace when the IQ-based time-domain trace is above a threshold for at least one of (a) longer than a predefined period of time, (b) shorter than the predefined period of time, (c) within a predefined time range, and (d) outside of the predefined time range.

14. The method of claim 10, wherein
the triggering on an event step includes triggering on an event in the IQ-based time-domain trace when the IQ-based time-domain trace is below a threshold for at least one of (a) longer than a predefined period of time, (b) shorter than the predefined period of time, (c) within a predefined time range, and (d) outside of the predefined time range.

15. The method of claim 10, wherein
the triggering on an event step includes triggering on an event in the IQ-based time-domain trace when the IQ-based time-domain trace is outside of a window defined by first and second thresholds.

16. The method of claim 10, wherein
the triggering on an event step includes triggering on an event in the IQ-based time-domain trace when a combination of the I and Q baseband component information corresponds to a predefined logic state.

17. The method of claim 10, wherein
the triggering on an event step includes triggering on an event in the IQ-based time-domain trace responsive to a predefined sequence of states,
wherein the states include (a) a first state in which the IQ-based time-domain trace is above a threshold and (b) a second state in which the IQ-based time-domain trace is below the threshold.

18. An article drawn from the set including floppy disks, optical disks, fixed disks, volatile memory, non-volatile memory, random access memory, read-only memory, or flash memory, comprising a machine-accessible medium having associated instructions that, when executed in a test and measurement device, results in a machine performing the steps of claim 10.

* * * * *